United States Patent [19]

Cherry et al.

[11] Patent Number: 4,832,753
[45] Date of Patent: May 23, 1989

[54] HIGH-PURITY CLEANING SYSTEM, METHOD, AND APPARATUS

[75] Inventors: Roger L. Cherry, West Linn; Joseph J. Burke; Christopher W. Platt, both of Portland; Craig H. Cowles, Tigard, all of Oreg.

[73] Assignee: Tempress Measurement & Control Corporation, Beaverton, Oreg.

[21] Appl. No.: 53,202

[22] Filed: May 21, 1987

[51] Int. Cl.⁴ ................................................. B05B 5/00
[52] U.S. Cl. ................................. 134/22.18; 134/10; 134/21; 134/22.19; 134/25.4; 134/26; 134/37; 134/42
[58] Field of Search ................... 134/12, 10, 21, 25.4, 134/30, 22.19, 26, 31, 32, 18, 22.18, 37

[56] References Cited

U.S. PATENT DOCUMENTS 4,443,269 4/1984 Capella et al. .................... 134/10
4,606,774 8/1986 Morris ............................. 134/10

Primary Examiner—Asok Pal
Attorney, Agent, or Firm—Chernoff, Vilhauer, McClung & Stenzel

[57] ABSTRACT

A system for high purity cleaning of components includes a cleaning chamber which is maintained at a pressure above ambient atmospheric pressure. A gas-glide transporter extends through the cleaning chamber and includes a pair of slightly tilted elongate tubes having a plurality of tiny holes therein. The tubes communicate with a source of filtered pressurized nitrogen. A tray for carrying components to be cleaned is adapted to fit on the tubes and slide down the transporter on a frictionless cushion of nitrogen. Components are cleaned of very small particles by using a high pressure spray of individual droplets of solvent which knock the particles off the component to be cleaned. The particles, solvent and solvent vapor are swept away from the component being cleaned by a stream of dry, filtered air. The cleaning chamber group includes a control panel which controls solvent supply and recovery modules. The cleaning chamber group is modular so that it may be placed in a Class 100 environment.

21 Claims, 3 Drawing Sheets

HIGH-PURITY CLEANING SYSTEM, METHOD, AND APPARATUS

BACKGROUND OF THE INVENTION

This invention relates to a system, method, and apparatus for high-purity cleaning of manufacturing components, and particularly to such a system, method, and apparatus which enable components to be cleaned, dried, and packaged in a clean environment.

Certain industries, such as manufacturers of silicon chips or other semi-conductors, require that manufacturing and storage components be extremely clean, substantially free of contaminant films and micron and sub-micron particle contamination. One method of high-purity cleaning is to wash the items to be cleaned with a high-pressure (2000–2400 psi) spray of solvent as described in Capella et al. U.S. Pat. No. 4,443,269. However, the process and apparatus disclosed in Capella are designed specifically for the removal of radioactive particles and contaminants and are not particularly suited to clean an item for future use so that the item becomes and remains substantially free of all contaminants and particles, not merely free of radioactive contaminants and particles.

For example, the method of Capella employs a cleaning chamber having sub-atmospheric pressure so that radioactive particles do not "blow" out of the chamber. This creates the possibility that non-radioactive particles proximate the cleaning chamber will be drawn into the chamber, especially when the chamber is opened to remove a component from the chamber. Since Capella is concerned primarily with radioactive particles, Capella's system filters particles out of the solvent and then reuses the filtered solvent, which could contain dissolved contaminants. Moreover, Capella does not provide for drying or packaging the components so that they remain "clean," i.e. substantially free of all particulate contamination.

SUMMARY OF THE INVENTION

The present invention provides a system, method, and apparatus for high-purity cleaning of components and for maintaining the components in a clean condition during drying and packaging. The system according to the present invention is modular, so that the cleaning chamber and the system controls may be isolated within a class 100 clean environment, with the "dirty" components located remote from, or sealed off from, the cleaning chamber and controls.

The cleaning chamber of the system includes an air delivery and filtration system that directs a stream of dry, warm, filtered air directly onto the items being cleaned while the item is simultaneously being sprayed with a high-pressure dispersion of solvent droplets. The air flow provided by the air system is sufficient, in volume and purity, to make the inside of the cleaning chamber a Class 10 environment. The air system maintains the pressure in the cleaning chamber above ambient atmospheric pressure.

The cleaning system also includes a solvent pumping and spraying system capable of delivering a spray of solvent at up to 6000 psi. The combination of high pressure and a small spraying orifice acts to create a spray of tiny solvent droplets which act as "fluid hammers" to knock very small, sub-micron particles off of the components to be cleaned, dispersing the particles into the chamber where they are carried away by the stream of clean, dry air flowing over the item and through the chamber.

For automated cleaning, the cleaning chamber includes a gas-glide transporter for moving the components to be cleaned into, through, and out of the cleaning chamber without substantially introducing extraneous particulate contamination into the chamber.

The cleaning chamber may be constructed to any size and may be adapted to cooperate with an adjacent drying chamber, which, like the cleaning chamber, may be operated at an environment down to Class 10.

Accordingly, it is a principal object of the present invention to provide an improved high-purity cleaning system, method, and apparatus.

It is a particular object to provide such a system, method, and apparatus which not only cleans the material of pre-existing contaminants, but prevents contamination during cleaning, drying, and packaging.

It is an associated object to provide a cleaning system having a positive pressure within the cleaning chamber.

It is a further object to provide a system which supplies the cleaning chamber with a flow of dry, warm, filtered air sufficient to maintain a Class 10 environment.

It is another object to provide a cleaning system to clean objects with a very high-pressure solvent spray of tiny droplets to knock particles off of the components to be cleaned.

It is a further object to provide a cleaning system which can transport material into, through, and out of the cleaning chamber substantially without the introduction of extraneous contaminants.

It is another object to provide a system having a cleaning chamber and a control system which can be operated within a clean environment with other components of the system remote or sealed off from the clean environment.

The foregoing and other objectives, features, and advantages of the invention will be more readily understood upon consideration of the following detailed description of the invention, taken in conjunction with the accompanying drawings.

DETAILED DESCRIPTION OF THE INVENTION

FIGS. 1–6 show exemplary embodiments of the cleaning system of the present invention, and features thereof.

Figure 3:
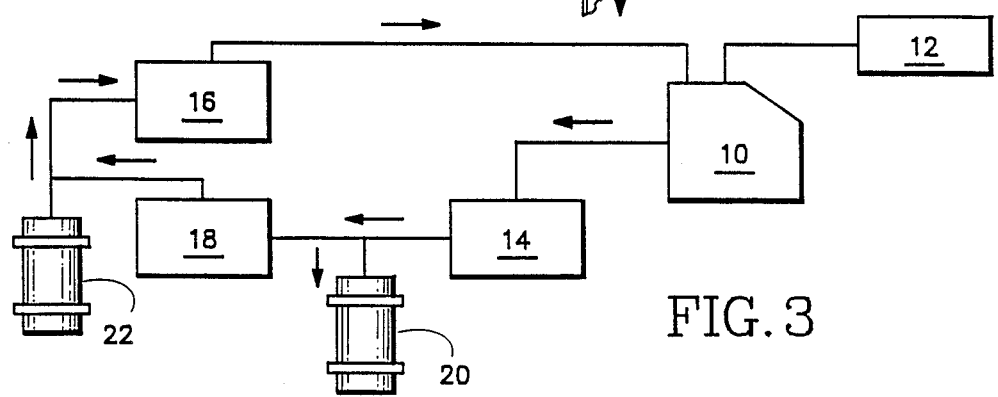
FIG. 3 is a schematic view of an exemplary system including a distillation group.

Starting with FIG. 3, an exemplary cleaning system according to the present invention includes a cleaning chamber group 10, a control system 12, a used solvent recovery group 14, and a pump group 16. If the system is distilling and reusing the newly distilled solvent, a distillation group 18 is located between the used solvent recovery group and the pump group. If the system is using new solvent, the recovered solvent is fed to a used solvent container 20, and new solvent is supplied to the pump group from a new solvent container 22.

Figure 1:
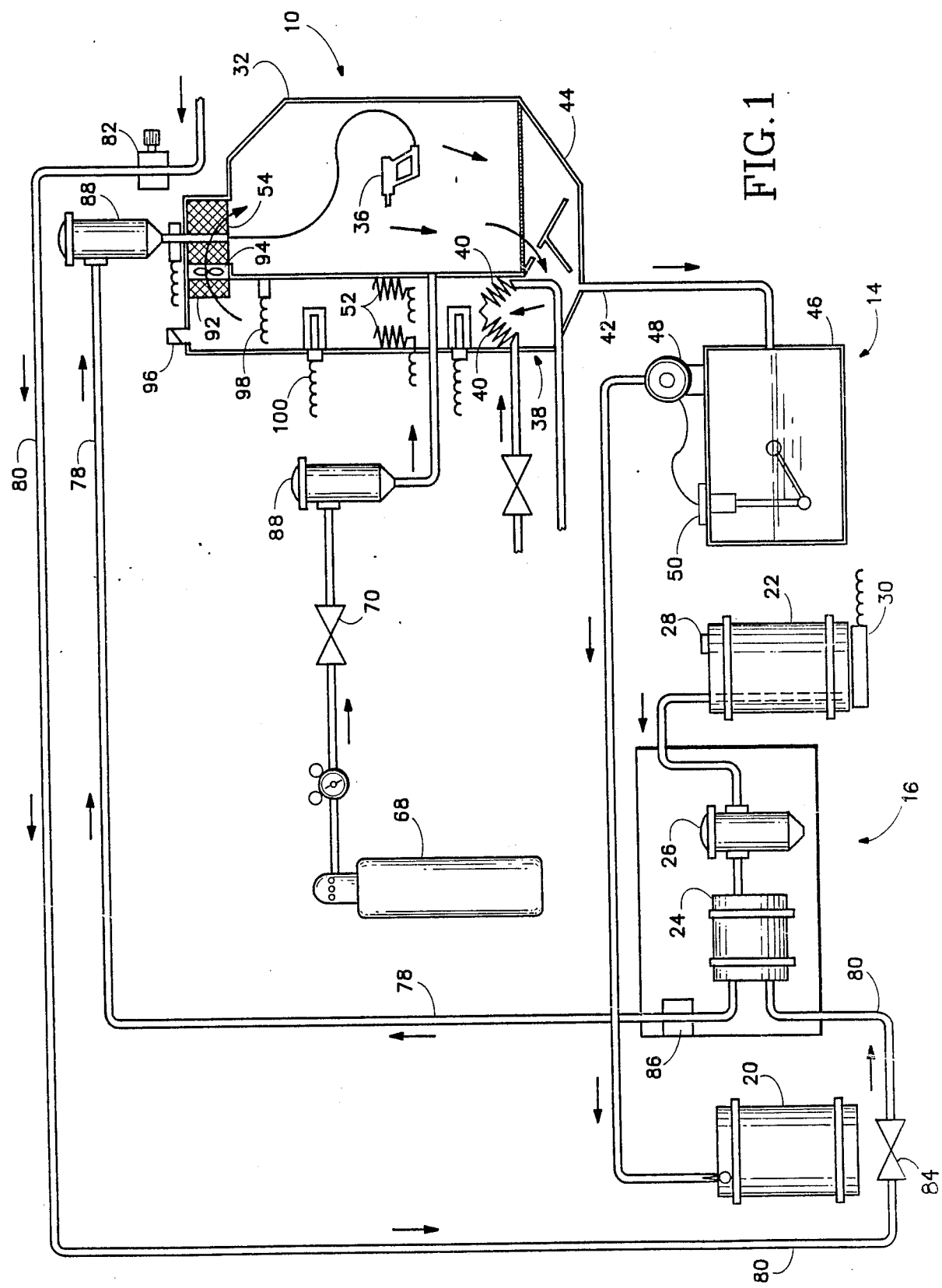
FIG. 1 is a schematic view of an exemplary system according to the present invention.

Turning to FIG. 1, an exemplary embodiment of a system which does not use a distillation group includes a cleaning chamber group 10, a used solvent recovery group 14, a pump group 16, new solvent container 22, and a used solvent container 20. The basic operation of the system may be explained by tracing the flow of solvent through the system.

A positive displacement, high-pressure pump 24 draws new, clean solvent out of container 22, through filter 26 and pushes the new solvent through the solvent supply line 78 toward the location of the cleaning chamber group. The pump is an airless type pump which is adapted to supply a liquid, under pressure, without air entrained in the liquid. The pump is powered by a regulated supply of air pressure, such as "factory air" through the pump control air line 80. A regulator 82 ensures that air is supplied to the pump at a constant pressure. The pump control air line 80 includes an emergency shutdown valve 84 to shut down the pump if the control system 12 senses a dangerous situation.

The pump is "on demand," it does not operate unless pressure in the solvent supply line 78 falls below a predetermined level. The use of an on-demand pump is important for several reasons. An operating pump, with parts moving against other parts, has a tendency to shed particles. A pump which operates continuously also has a tendency to heat up, which increases particle shedding. An on-demand pump also eliminates the need for complex valving to relieve the pressure created by constant operation. A pump which has very few moving parts which are wetted, i.e. touched by the solvent, is well suited for this purpose.

The primary purpose of filter 26, preferably a 400 mesh filter which is capable of filtering particles as small as 1-2 microns, is to ensure that such particles do not enter into and score the inner working surfaces of the pump which operates with rather small tolerances. A 0.2 micron vent filter 28 on the new solvent container ensures that particles are not drawn into the container when air enters the container through the vent. A load cell 30, detects the weight of the new solvent container and is operatively connected to the control system to alert the operator, or to shut down the system, when the container is nearly empty.

Following the flow of solvent downstream from the pump, a surge surpresser 86 dampens out surges caused by sudden operation of the pump. Prior to entering the cleaning chamber 32 the new solvent passes through another filter 88 adapted to filter out all particles larger than 0.2 microns. A pressure transducer 34, downstream of the filter, provides the operator with a readout of the pressure in the solvent supply line at the control panel and can cause the valve 84 in the pump control air line 80 to close if the pressure in the solvent supply line becomes too high.

In the cleaning chamber, the solvent is fed to a solvent gun 36 through a flexible hose and is shot from the solvent gun in a very high-pressure spray of tiny droplets whose impact is sufficient to actually knock submicron particles off the surface of the component being cleaned. The combination of a very high-pressure (2,500-6,000) and a relatively small orifice (less than twenty thousandths) on the solvent gun yield a solvent spray which is characterized by very small, fast-moving droplets traveling in excess of 100 meters per second at approximately 4"-18" from the orifice of the solvent gun. The droplets act as a "fluid hammer" to actually knock particles off the component to be cleaned. Closer to the orific the spray has not yet had an opportunity to form a dispersion of droplets, while further than 18" from the orifice the solvent may partially vaporize, reducing its effectiveness at cleaning. The high pressure and small orifice result in a flow of 0.5-1.0 gallons per minute, a substantial savings over other systems which use much more solvent without cleaning as effectively.

Applicant believes that Capella, which discloses a system which delivers "solvent at a range of 4-4.6 gallons per minute at a pressure in the range of 2,000-2400 pounds per square inch," actually delivers multiple streams of liquid solvent onto the article to be cleaned. A stream of liquid solvent flowing over a surface does not have the same mechanical impact as a dispersion of individual droplets impacting the surface. When liquid flows over a surface, a thin, boundary layer of essentially zero velocity is created. Small sub-micron particles can "hide out" in this boundary layer or hide out in eddys in the solvent flow caused by small surface irregularities. Comparatively, individual droplets, from a source of the identical pressure, can create three to four times the impact on a small particle than can a stream of fluid.

In addition to the fluid hammer effect of the tiny droplets, applicant directs a strong flow of dry, filtered air over the item being cleaned and through the chamber. The air flow is introduced at the top of the chamber and drawn out through the bottom of the creating a strong, substantially laminar flow of air through the chamber. This air stream carries the solvent droplets, solvent vapor, and free particles away from the item being cleaned so that particles do not readhere to the wet surface. While free particles are carried away with the solvent vapor other particles are likely to become bound to the solvent droplets.

The air supply system of the present invention moves a sufficient volume of very clean, dry air through the cleaning chamber to meet the requirements for a Class 10 environment as described in Federal Standard 209(c) of the "Federal Standard Clean Room and Work Station Requirements, Controlled Environment." The clean, dry air, which is maintained near ambient temperature, flowing past the article being cleaned at approximately 50 feet per minute tends to dry the article very quickly thereby discouraging subsequent particle readhesion common to wetted surfaces.

As the spray of solvent droplets travels further away from the gun, some of the solvent may vaporize because the pressure in the chamber, which is slightly above atmospheric pressure, is much less than that of the pressurized solvent. The vaporized solvent as well as the other air in the chamber is drawn out of the bottom of the chamber and up through a condensor 38 including cooling coils 40 which cool the vapor/air mixture from the chamber so that the solvent condenses and drains out of the chamber through a drain 42. Liquid solvent in the chamber would also be directed toward the drain by the V-shaped bottom 44 of the chamber. The used solvent is collected in a recovery tank 46 including a pump 48 and a float switch 50 which automatically pumps the used solvent to the used solvent container 20.

After the solvent has condensed out of the chamber atmosphere, the remaining air is drawn up past heating coils 52 which raise the temperature of the air to compensate for the cooling effect of the condensor. The heating coils are controlled by a thermo-couple 100 to raise the temperature of the air up to or above ambient temperature. The air is then drawn through a pre-filter 92 and a fan 94, and pushed through a high efficiency particle air ("HEPA") filter 54 to remove any free particle contaminants in the air. The HEPA used by applicant can remove 99.99% at 0.3 microns. The dissolved contaminants and particulate contaminants which become bound to the solvent were carried away with the condensed solvent.

In order to maintain the pressure within the cleaning chamber above atmospheric pressure, a make-up air damper 96 is controlled by a pressure transducer 98 to add sufficient air to keep the pressure in the chamber above atmospheric pressure. The air supply system exchanges the air in the cleaning chamber approximately every 10 seconds.

Figure 4:
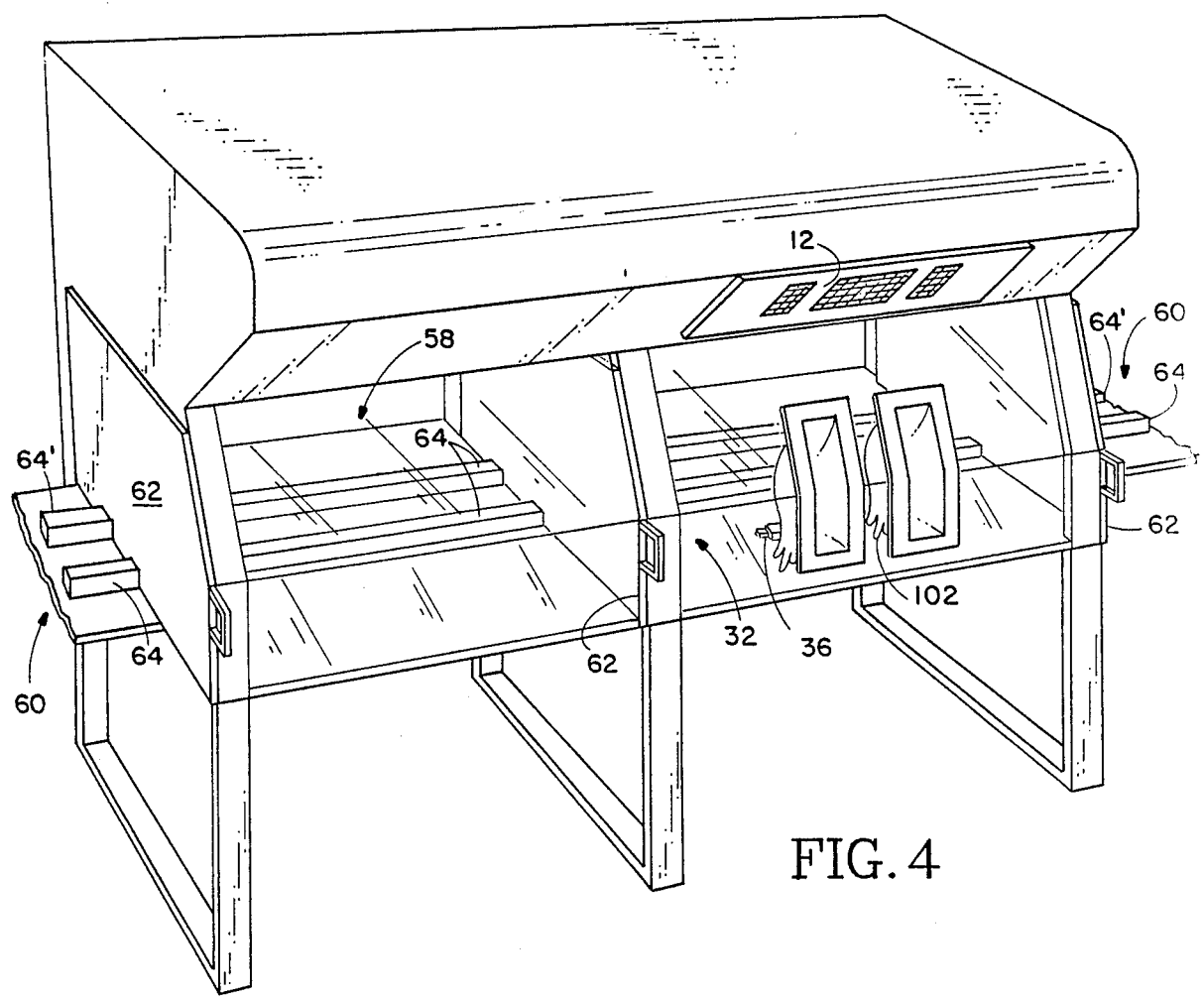
FIG. 4 is an artist's view of an exemplary cleaning chamber group including a control panel, a drying chamber, and a gas-glide transporter.
Figure 5:
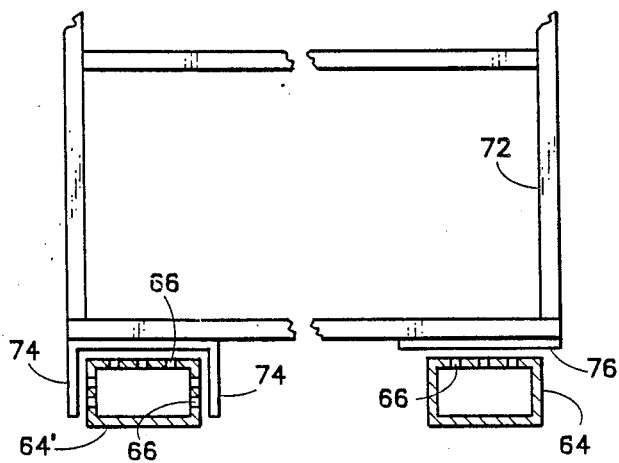
FIG. 5 is an elevational view of a cleaning tray mounted on a cross-section of the gas-glide transporter.

Turning to FIG. 4, an exemplary cleaning chamber 32 is shown. A control panel 12 is co-located with the cleaning chamber. The control panel is connected to the various valves, sensors, and controls discussed above so that the operator can monitor and control the entire system from his position at the cleaning chamber. The operator can reach into the cleaning chamber to operate the solvent gun and manipulate the components to be cleaned through a pair of gloves 102 which are sealed in a see-through wall of the chamber. A drying chamber 58 is arranged next to the cleaning chamber and, like the cleaning chamber, is also sealed. In the exemplary embodiment shown in FIG. 4, the air system would provide the same flow of clean, dry air to the drying chamber as has been described with respect to the cleaning chamber. A door 62 between the cleaning and drying chambers may be opened by the operator to move articles from the cleaning chamber to the drying chamber. Similar doors 62 on the entrance to cleaning chamber 40 and the exit from drying chamber permit articles to be moved into and out of the chambers. A gas-glide transporter 60 extends through the cleaning and drying chambers.

Figure 2:
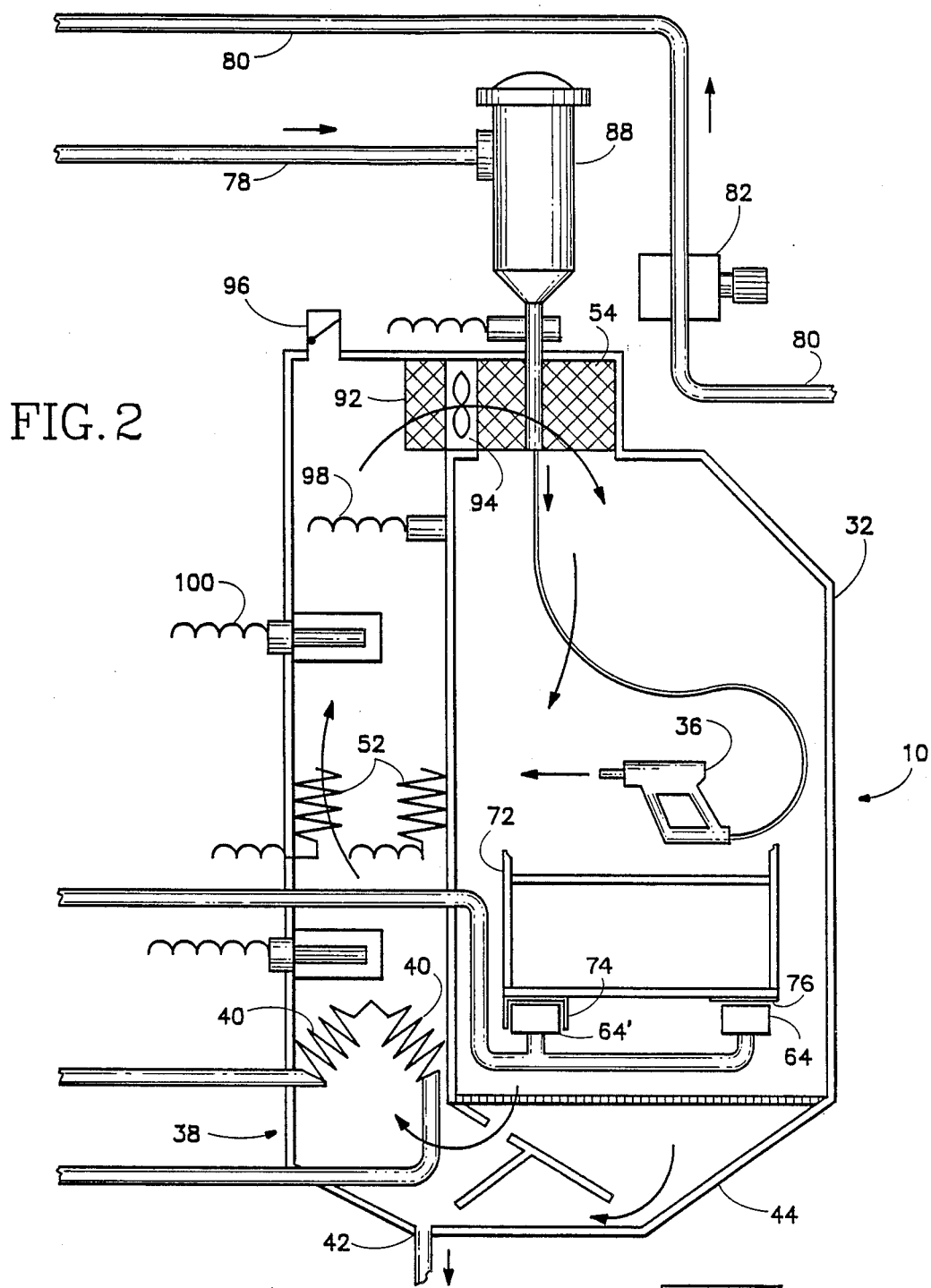
FIG. 2 is a schematic view of an exemplary cleaning chamber including air supply system, condensate system, and gas-glide transporter.
Figure 6:
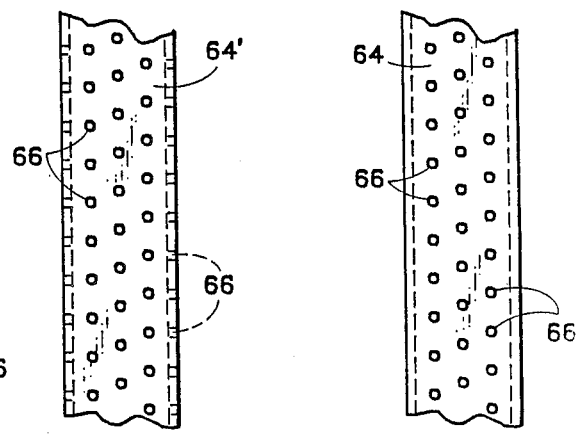
FIG. 6 is a partial top view of the gas-glide transporter shown in FIG. 5.

With attention to FIGS. 1, 2, 5, and 6, as well as FIG. 4, the gas-glide transporter includes a pair of rectangular tubes 64 and 64'. As shown in FIG. 6, the top of tube 64 includes many small holes 66 in a biased pattern while the top and both sides of the guide tube 64' also include such holes in a similar pattern. Except for these small holes, the tubes are otherwise airtight and are fed with a pressurized filtered gas such as nitrogen ($N_2$) as shown in FIG. 1. A bottle of $N_2$ 68 under pressure, controlled by a valve 70 and passing through a 0.2 micron filter 88, is fed into the cleaning chamber and into the gas-glide tubes 64 and 64' as shown in FIG. 2.

As shown in FIG. 4, a cleaning tray 72 is adapted to be supportably guided by the tubes. The cleaning tray includes one supporting foot 74 which fits over the top and sides of the guide tube 64' and a supporting sole 76 which is positioned over the top of the other tube 64. The tubes are slightly slanted so that the infeed end of the tubes near the cleaning chamber is slightly higher than the outfeed end near the drying chamber. When pressurized nitrogen is fed to the tubes, the tray is supported by a frictionless cushion of $N_2$ between the foot and sole of the tray and their respective tubes. Since the tubes are slanted, the tray will glide down the tube toward the lower end. When the supply of $N_2$ is cut off, the tray settles directly onto the tubes and the friction between the tray and the tubes prevents the tray from moving. In this fashion movement of the tray into, through, and out of the chambers may be completely and precisely controlled by the operator through the control system from his position at the cleaning chamber.

Typical transport systems such as belts or chains, which are powered by motors, and supported by bearings or journals, tend to be "dirty" in that they have many moving parts which can generate and shed particles. The gas-glide disclosed above has no moving parts and is not apt to introduce any particles or other contaminants into the chamber since the $N_2$ is filtered prior to entering the chambers.

As previously noted, doors 62 at either end of the chamber may be opened by the operator to permit the components to be placed or transported into or out of the chambers. Several techniques eliminate or reduce the introduction of particles into the chambers when the chambers are opened. First, the modular design of the system enables the "dirty" functions of the system to be located remote from the cleaning chamber and control system so that the cleaning chamber itself may be placed in a clean environment, up to class 100. Pumps, motors and other components of the system which would not be able to operate in a class 100 environment are enclosed or separated from the cleaning chamber group. Placing the cleaning chamber in such a clean environment reduces the possibility of contamination when the chamber is opened. In addition, the chamber of the present invention is maintained at a pressure which is above atmospheric pressure, causing air to flow out of the chambers when the chamber doors are opened.

The system and method have been described above in operation with a solvent such as Freon. Other solvents such as denatured alcohol, carbon tetracloride, or dionized water, or combinations of solvents, would behave somewhat differently. For example, when alcohol is used as a solvent, there would be less vaporization than Freon, and when deionized water is used there would be virtually no vaporization. However, operation of the system would be essentially the same, with more of the solvent running out of the chamber as a liquid and less being condensed out of the chamber atmosphere.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A method of high purity cleaning including particle removal from an item to b cleaned, comprising:
    (a) providing a cleaning chamber which may be substantially sealed to provide a clean environment;
    (b) introducing an item to be cleaned into said chamber;
    (c) introducing a flow of dry, filtered air into said chamber;
    (d) maintaining the pressure in said chamber to a pressure which is above atmospheric pressure so as to prevent infiltration of contaminants into said chamber;

(e) providing a high pressure solvent sprayer for introducing and dispersing a spray consisting primarily of individual droplets of solvent into said chamber;

(f) striking said item to be cleaned with said droplets of solvent dispersed from said sprayer so as to dislodge contaminant particles from said item;

(g) directing a substantially laminar flow of dry, filtered air at a temperauure not substantially less than ambient temperature over said item being struck by said droplets of solvent so as to draw solvent and dislodged contaminant particles away from said item being cleaned; and (h) performing steps (f) and (g) substantially simultaneously.

2. The method of claim 1 wherein said droplets in said spray travel in excess of 100 meters per second.

3. The method of claim 1, including the step of forcing solvent under pressure through an orifice, said pressure being in excess of 2,500 psi and said orifice having a diameter of less than twenty thousandths of an inch.

4. The method of claim 1, including the step of knocking particles off of said item to be cleaned with said droplets of solvent and carrying said particles and said solvent away from said item to be cleaned with a stream of clean, dry air.

5. An apparatus for high purity cleaning of items including:

(a) a cleaning chamber substantially sealed from the outside environment;

(b) air supply means for providing said chamber with a constant supply of filtered air and for maintaining chamber pressure above ambient atmospheric pressure;

(c) a gas-glide transporter including a first portion arranged partially within said chamber and a second portion partially without said chamber;

(d) carrier means compatible with said transporter for supporting said items to be cleaned on said transporter, said chamber including door means for permitting said carrier to pass into or out of said chamber on said transporter; and (e) control means for selectively causing said carrier to move along said transporter.

* * * * *